United States Patent
Mugikura

(10) Patent No.: US 11,223,366 B2
(45) Date of Patent: Jan. 11, 2022

(54) ANALOG TO DIGITAL CONVERTER, ANALOG TO DIGITAL CONVERSION METHOD, AND DISPLACEMENT DETECTION APPARATUS

(71) Applicant: MITUTOYO CORPORATION, Kanagawa (JP)

(72) Inventor: Shun Mugikura, Kawasaki (JP)

(73) Assignee: MITUTOYO CORPORATION, Kawasaki (JP)

(*) Notice: Subject to any disclaimer, the term of this patent is extended or adjusted under 35 U.S.C. 154(b) by 149 days.

(21) Appl. No.: 16/810,130

(22) Filed: Mar. 5, 2020

(65) Prior Publication Data

US 2020/0321973 A1 Oct. 8, 2020

(30) Foreign Application Priority Data

Apr. 5, 2019 (JP) .............................. JP2019-072864

(51) Int. Cl.
*G01D 5/34* (2006.01)
*H03M 1/40* (2006.01)
*H03M 1/46* (2006.01)

(52) U.S. Cl.
CPC ................ *H03M 1/40* (2013.01); *G01D 5/34* (2013.01); *H03M 1/462* (2013.01)

(58) Field of Classification Search
CPC ........... H03M 1/40; H03M 1/462; G01D 5/34

USPC ....................................................... 250/231.1
See application file for complete search history.

(56) References Cited

U.S. PATENT DOCUMENTS

2020/0007139 A1* 1/2020 Kawai ................... H03M 1/144

FOREIGN PATENT DOCUMENTS

JP 2008-028820 A 2/2008

* cited by examiner

*Primary Examiner* — Georgia Y Epps
*Assistant Examiner* — Kevin Wyatt
(74) *Attorney, Agent, or Firm* — Oliff PLC

(57) ABSTRACT

Errors in a cyclic analog to digital converter are reduced. An analog to digital converter is a cyclic analog to digital converter for converting an analog input signal into a digital output signal by performing a plurality of times of cycle processing on the analog input signal. A cycle processing unit performs the cycle processing and outputs a digital signal indicating a value of each bit of the digital output signal. An output circuit receives the digital signal output from the cycle processing unit and outputs, as an output signal, a signal obtained by inverting the digital signal every other cycle. A signal input to the cycle processing unit in second and subsequent cycles is generated in the cycle processing in a previous cycle. In the cycle processing, processing for inverting the signal input to the cycle processing is performed.

11 Claims, 8 Drawing Sheets

ANALOG TO DIGITAL CONVERTER, ANALOG TO DIGITAL CONVERSION METHOD, AND DISPLACEMENT DETECTION APPARATUS

INCORPORATION BY REFERENCE

This application is based upon and claims the benefit of priority from Japanese patent application No. 2019-72864, filed on Apr. 5, 2019, the disclosure of which is incorporated herein in its entirety by reference.

BACKGROUND

The present disclosure relates to an analog to digital converter, an analog to digital conversion method, and a displacement detection apparatus.

An analog to digital (A/D) converter called a cyclic type or an algorithmic type is known as one type of A/D converters. A configuration of a common cyclic A/D converter has been proposed in, for example, Japanese Unexamined Patent Application Publication No. 2008-28820.

This A/D converter includes an analog/digital (A/D) conversion circuit, a digital/analog (D/A) conversion circuit, an amplification circuit, an input difference circuit, and two switches. The A/D conversion circuit converts an input analog signal into a digital signal. The D/A conversion circuit converts an output of the A/D conversion circuit into an analog signal. The amplification circuit amplifies the input analog signal. In Japanese Unexamined Patent Application Publication No. 2008-28820, the amplification circuit amplifies the input analog signal twice. The input difference circuit calculates a difference between an output of the amplification circuit and an output of the D/A conversion circuit. By switching of the two switches, one of the analog input signal and an output of the input difference circuit is selected, and the selected one is input to the A/D conversion circuit and the amplification circuit.

In this A/D converter, the output of the input difference circuit sampled in a certain cycle is input to the A/D conversion circuit and the amplification circuit in the next cycle, so that the recursive conversion can be performed in the A/D conversion circuit. Then, the value of each bit can be obtained in order from the most significant bit by the repetition of the cycle. Thus, by repeating N (N is an integer of 2 or more) cycles, it is possible to configure the A/D converter that converts the analog input signal into the digital signal having the number of bits represented by a product of N and the number of bits of the A/D conversion circuit.

SUMMARY

The above-described common cyclic A/D converter performs analog/digital conversion by cycling signals in one stage of a pipeline A/D converter N times, which reduces the circuit size. However, the above-described common cyclic A/D converter has a problem that errors such as an offset of amplification are accumulated, and thus the linearity tends to be deteriorated, because the same A/D conversion circuit is repeatedly used. For example, in the above-described A/D converter, an error generated in a certain cycle is amplified twice by an amplifier in the next cycle, and the error increases as the number of times of amplification increases.

The present disclosure has been made in view of the above circumstances. An object of the present disclosure is to reduce an error in a cyclic analog to digital converter.

A first example aspect of the present disclosure is an analog to digital converter that is a cyclic analog to digital converter for converting an analog input signal into a digital output signal by performing a plurality of times of cycle processing on the analog input signal. The analog to digital converter includes: a cycle processing unit configured to perform the cycle processing and output a digital signal indicating a value of each bit of the digital output signal; and an output circuit configured to receive the digital signal output from the cycle processing unit and output, as an output signal, a signal obtained by inverting the digital signal every other cycle. A signal input to the cycle processing unit in second and subsequent cycles is generated in the cycle processing in a previous cycle, and in the cycle processing, processing for inverting the signal input to the cycle processing unit is performed.

A second example aspect of the present disclosure is the above analog to digital converter, in which the output circuit desirably includes: a D flip-flop including an inverted output terminal connected to an input terminal; and an exclusive or circuit, one input of the exclusive or circuit receiving the digital signal and the other input thereof being connected to an output terminal of the D flip-flop.

A third example aspect of the present disclosure is the above analog to digital converter, in which the output circuit is desirably configured to output the digital signal as the output signal in odd-numbered cycles and output a signal obtained by inverting the digital signal as the output signal in even-numbered cycles.

A fourth example aspect of the present disclosure is the above analog to digital converter, in which in an initial state, an output value of the output terminal of the D flip-flop is desirably set to "0", and an output value of the inverted output terminal of the D flip-flop is desirably set to "1".

A fifth example aspect of the present disclosure is the above analog to digital converter desirably further including an inverter circuit configured to output a signal obtained by inverting an output of the cycle processing unit to the cycle processing unit.

A sixth example aspect of the present disclosure is the above analog to digital converter, in which N is desirably an integer of 2 or more, the cycle processing unit is configured to convert the analog input signal into an N-bit digital signal by acquiring one bit of the digital signal in each of the cycle processing, convert the analog input signal into the digital signal in a first cycle, and convert a signal output from the inverter circuit in a previous cycle into the digital signal in the second and subsequent cycles.

A seventh example aspect of the present disclosure is the above analog to digital converter, in which the cycle processing unit desirably including: a selection circuit configured to output the analog input signal in the first cycle and output the signal output from the inverter circuit in the second and subsequent cycles, a sample holding circuit configured to sample the signal output from the selection circuit according to a timing signal and output the sampled signal; a comparator configured to compare a voltage of the sampled signal and a ground voltage and output a result of the comparison as the digital signal; a D/A conversion circuit configured to receive the digital signal, output a voltage obtained by inverting a reference voltage when the voltage of the sampled signal is higher than the ground voltage, and output the reference voltage when the voltage of the sampled signal is lower than the ground voltage; an amplifier configured to amplify the voltage of the sampled signal twice; and an adder configured to add the voltage amplified by the amplifier and the voltage output from the D/A conversion circuit and output the added voltage to the inverter circuit.

An eighth example aspect of the present disclosure is the analog to digital converter in which the cycle processing unit includes: a selection circuit configured to output the analog input signal in a first cycle and output the signal output in the previous cycle in the second and subsequent cycles, a sample holding circuit configured to sample the signal output from the selection circuit according to a timing signal and output the sampled signal; a comparator configured to compare a voltage of the sampled signal and a ground voltage and output a result of the comparison as the digital signal; a D/A conversion circuit configured to receive the digital signal, output a voltage obtained by inverting a reference voltage when the voltage of the sampled signal is higher than the ground voltage and output the reference voltage when the voltage of the sampled signal is lower than the ground voltage; an inverting amplifier configured to amplify the voltage of the sampled signal twice and invert the amplified voltage; and an adder configured to add the voltage output from the inverting amplifier and the voltage output from the D/A conversion circuit and output the added voltage.

A ninth example aspect of the present disclosure is the analog to digital converter in which the sampled signal is input to a non-inverted input terminal of the comparator, and the ground voltage is input to an inverted input terminal of the comparator, and the D/A conversion circuit is configured to output a voltage obtained by inverting the reference voltage when a value of the digital signal is "1" and output the reference voltage when the value of the digital signal is "0".

A tenth example aspect of the present disclosure is a displacement detection apparatus including: a displacement detector configured to output an analog signal indicating a measured displacement; and a signal processing unit configured to detect a displacement based on the analog signal indicating the measured displacement. The signal processing unit includes: the above analog to digital converter; and an arithmetic unit configured to calculate the displacement based on the digital signal output from the analog to digital converter. The analog to digital converter is configured to receive the analog signal indicating the measured displacement as the analog input signal and converts the analog signal into the digital signal.

An eleventh example aspect of the present disclosure is an analog to digital conversion method in a cyclic analog to digital converter for converting an analog input signal into a digital output signal by performing a plurality of times of cycle processing on the analog input signal. The analog to digital method includes: using a signal generated in a previous cycle as an input to a next cycle processing, performing the cycle processing and outputting a digital signal indicating a value of each bit of the digital output signal; and outputting, as an output signal, a signal obtained by inverting the digital signal every other cycle. A signal to be subject to the cycle processing second and subsequent cycles is generated in the cycle processing in a previous cycle, and in the cycle processing, processing for inverting the input signal is performed.

According to the present disclosure, it is possible to reduce errors in a cyclic analog to digital converter.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

Figure 1:
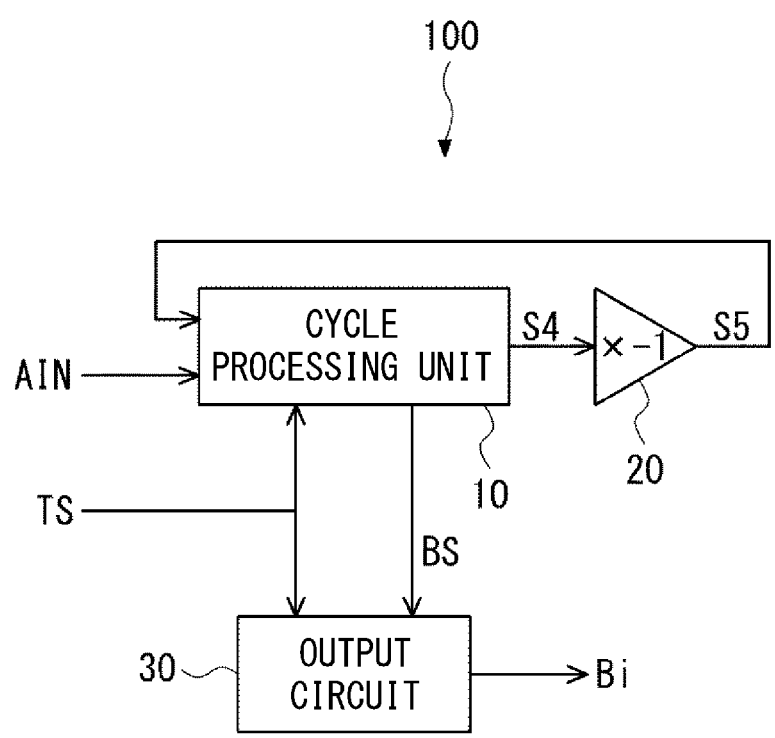
FIG. 1 schematically shows a configuration of an A/D converter according to a first embodiment.

Hereinafter, embodiments of the present disclosure will be described with reference to the drawings. In the drawings, the same elements are denoted by the same reference signs, and repeated descriptions will be omitted as necessary.

First Embodiment

Hereinafter, an analog to digital (A/D) converter according to a first embodiment will be described. An A/D converter 100 according to the first embodiment is configured as a cyclic A/D converter that converts an analog input signal AIN into a multi-bit digital signal OUT by performing a plurality of times of cycle processing. Specifically, the A/D converter 100 is configured as a cyclic A/D converter that converts the analog input signal AIN into an N-bit digital signal OUT by performing N (N is an integer of 2 or more) times of cycle processing. In other words, the A/D converter 100 is a cyclic A/D converter having a resolution of N bits, and performs N times of cycle processing on the analog input signal AIN, thereby obtaining a value of each bit in order from higher bits.

FIG. 1 schematically shows a configuration of the A/D converter 100 according to the first embodiment. The A/D converter 100 includes a cycle processing unit 10, an inverter circuit 20, and an output circuit 30. The cycle processing unit 10 is configured as a 1-bit A/D conversion circuit that performs A/D conversion processing for one cycle of a cyclic A/D converter.

The cycle processing unit 10 outputs a binary signal BS indicating a result of the A/D conversion to the output circuit 30, and outputs an analog signal S4 input to the cycle processing unit 10 to the inverter circuit 20 in the next cycle. The inverter circuit 20 outputs an analog signal S5 obtained by inverting the analog signal S4 to the cycle processing unit 10.

The cycle processing unit 10 is configured to convert the analog input signal AIN from analog to digital in a first cycle, and convert the analog signal S5 input from the inverter circuit 20 from analog to digital in second and subsequent cycles.

The output circuit 30 outputs a binary signal Bi indicating an i-th bit from the most significant bit corresponding to an i-th cycle according to a timing signal TS based on the binary signal BS. Here, i is a value indicating the number of cycles and is an integer of 1 or more and N or less.

Figure 2:
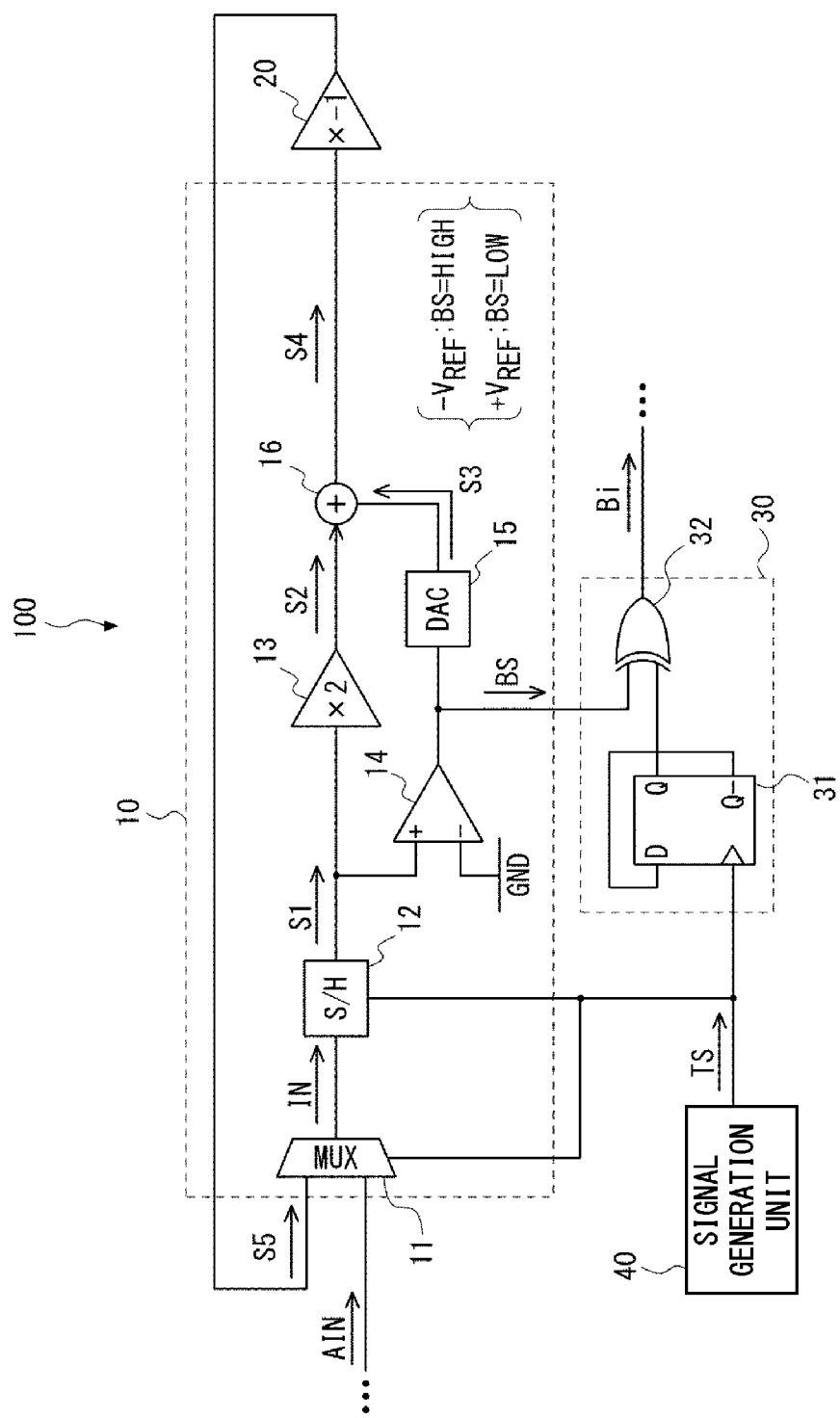
FIG. 2 shows the configuration of the A/D converter according to the first embodiment in more detail.

FIG. 2 shows the configuration of the A/D converter 100 according to the first embodiment in more detail. Compared with FIG. 1, the A/D converter 100 further includes a signal generation unit 40 that generates the timing signal TS in addition to the configuration shown in FIG. 1. Note that the signal generation unit 40 may be provided outside the A/D converter 100.

As shown in FIG. 2, the cycle processing unit 10 includes a selection circuit 11, a sample holding (S/H) circuit 12, an amplifier 13, a comparator 14, a Digital to Analog (D/A) conversion circuit 15, and an adder 16.

The selection circuit 11 is configured as a two-input one-output multiplexer (MUX). The analog input signal AIN is input to one input of the selection circuit 11, and the other input is connected to an output of the inverter circuit 20, and the analog signal S5 is input from the inverter circuit 20. The selection circuit 11 outputs one of the analog input signal AIN and the analog signal S5 to the S/H circuit 12 as an input signal IN based on the timing signal TS.

In the first cycle, the selection circuit 11 outputs the analog input signal AIN to the S/H circuit 12, for example, in response to the timing signal TS. Thus, in the first cycle, the S/H circuit 12 receives the analog input signal AIN as the input signal IN.

In the second and subsequent cycles, the selection circuit 11 outputs the analog signal S5 output in the previous cycle to the S/H circuit 12, for example, in response to the timing signal TS. Thus, the S/H circuit 12 receives the analog signal S5 as the input signal IN in the second and subsequent cycles.

The selection of the input signal IN according to such a cycle may be performed by the selection circuit 11 autonomously in response to the timing signal TS or may be performed by a separately provided control unit controlling the selection circuit 11.

The S/H circuit 12 outputs a sample signal S1 obtained by sampling the input signal IN.

The amplifier 13 outputs an analog signal S2 obtained by amplifying the sample signal S1 twice.

The comparator 14 compares the sample signal S1 with a ground voltage GND (i.e., zero voltage), and outputs a result of the comparison as the binary signal BS. In FIG. 2, a non-inverted input terminal (+) of the comparator 14 is connected to an output of the S/H circuit 12, and receives the sample signal S1. The ground voltage GND is input to an inverted input terminal (−) of the comparator 14. When a voltage of the sample signal S1 is greater than the ground voltage GND, the comparator 14 outputs "1" (HIGH) as the binary signal BS. When the voltage of the sample signal S1 is smaller than the ground voltage GND, the comparator 14 outputs "0" (LOW) as the binary signal BS. When the voltage of the sample signal S1 is equal to the ground voltage GND, the comparator 14 may output "0" (LOW) or may output "1" or "1" (HIGH) as the binary signal BS as necessary.

The D/A conversion circuit 15 converts the binary signal BS into an analog signal S3. Here, when the binary signal BS is "1" (HIGH), the D/A conversion circuit 15 outputs a signal having a voltage level of $-V_{REF}$ as the analog signal S3. When the binary signal BS is "0" (LOW), the D/A conversion circuit 15 outputs a signal having a voltage level of $-V_{REF}$ as the analog signal S3.

Here, $V_{REF}$ is a reference voltage for 1-bit A/D conversion processing performed by the cycle processing unit 10.

The adder 16 is configured as an arithmetic unit that adds the analog signal S2 output from the amplifier 13 and the analog signal S3 (i.e., $-V_{REF}$ or $-V_{REF}$) output from the D/A conversion circuit 15, and then outputs the analog signal S4.

The inverter circuit 20 inverts the analog signal S4 output from the adder 16, and then outputs the inverted analog signal S5 to the selection circuit 11.

Next, the output circuit 30 will be described. As shown in FIG. 2, the output circuit 30 includes a D flip-flop (hereinafter DFF) 31 and an exclusive-OR (hereinafter XOR) circuit 32.

A clock terminal of the DFF 31 receives the timing signal TS. A D terminal, which is an input terminal, is connected to a Q− terminal which is an inverted output terminal. A Q terminal, which is an output terminal, is connected to one input terminal of the XOR circuit 32. The other input terminal of the XOR circuit 32 receives the binary signal BS. The XOR circuit 32 outputs an XOR of the signal input from the Q terminal and the binary signal BS as the binary signal Bi.

Next, an operation of the A/D converter 100 according to this embodiment will be described. In the first and third cycles and subsequent odd-numbered cycles, the input signal IN sampled by the S/H circuit 12 is a signal that has passed through the inverter circuit 20 zero or even number of times. In the following descriptions, 0 is treated as an even number. On the other hand, in the second and subsequent even-numbered cycles, the input signal IN sampled by the S/H circuit is a signal that has passed through the inverter circuit 20 an odd number of times. The voltage level of the input signal IN is inverted every cycle, and the binary signal BS output from the comparator 14 is also inverted every cycle accordingly. The output circuit 30 is provided to correct this inversion of the binary signal BS in this configuration.

Figure 3:
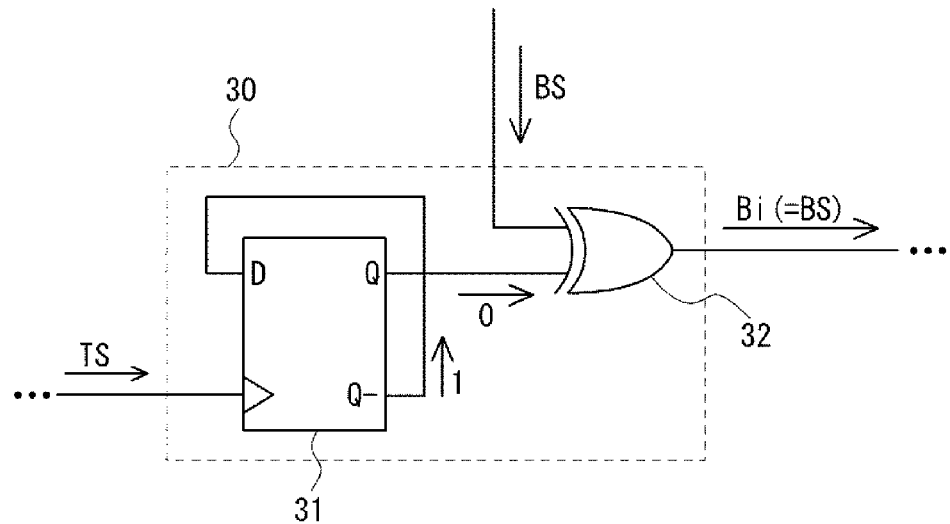
FIG. 3 shows an output circuit in an odd-numbered cycle.
Figure 4:
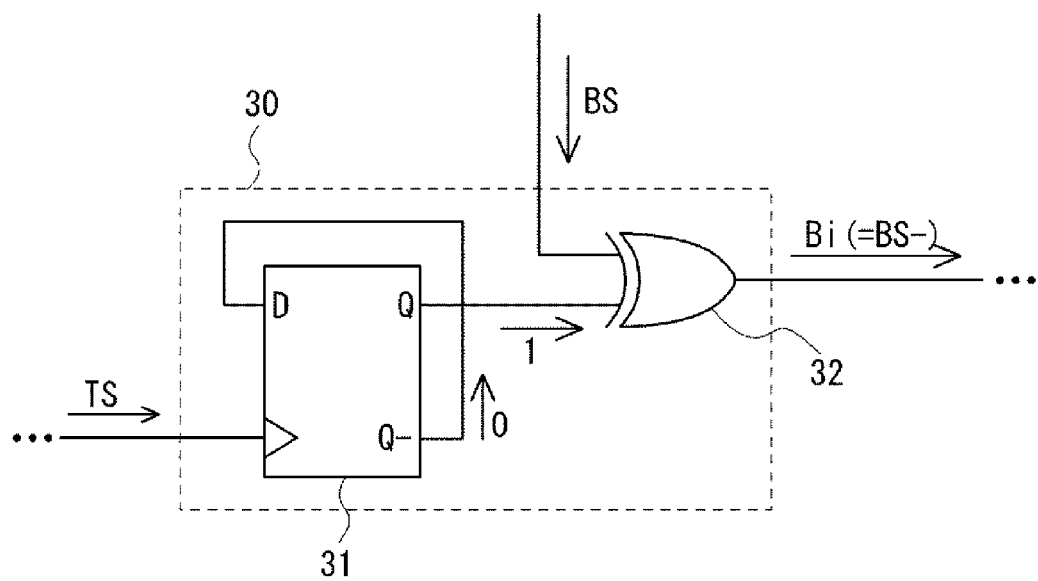
FIG. 4 shows an output circuit in an even-numbered cycle.

An operation of the output circuit 30 will be described. The DFF 31 is initially configured in such a way that an output of the Q terminal is "0" and an output of the Q− terminal is "1". FIG. 3 shows the output circuit 30 in an odd-numbered cycle, and FIG. 4 shows the output circuit 30 in an even-numbered cycle.

In the first cycle, since the output of the Q terminal is "0", and the output of the Q− terminal is "1", "0" is input to the XOR circuit 32 from the Q terminal. Thus, the XOR circuit 32 outputs, as the binary signal Bi, the same value as that of the binary signal BS. Further, the output "1" of the Q− terminal is input to the D terminal. Thus, when the DFF 31 receives the timing signal TS, the output of the Q terminal transitions from "0" to "1", and the output of the Q− terminal transitions from "1" to "0".

In the second cycle, since the output of the Q terminal is "1", and the output of the Q− terminal is "0", "1" is input to the XOR circuit 32 from the Q terminal. Thus, the XOR circuit 32 outputs a value (BS−) obtained by inverting the binary signal BS as the binary signal Bi. Further, the output "0" of the Q− terminal is input to the D terminal. Thus, when the DFF 31 receives the timing signal TS, the output of the Q terminal transitions from "1" to "0", and the output of the Q− terminal transitions from "0" to "1".

The third and subsequent odd-numbered cycles are the same as the first cycle, and the fourth and subsequent even-numbered cycles are the same as the second cycle, and descriptions thereof will be omitted.

As described above, the output circuit 30 corrects the binary signal BS output from the comparator 14, so that the binary signal Bi indicating the value of the i-th bit can be output.

Figure 5:
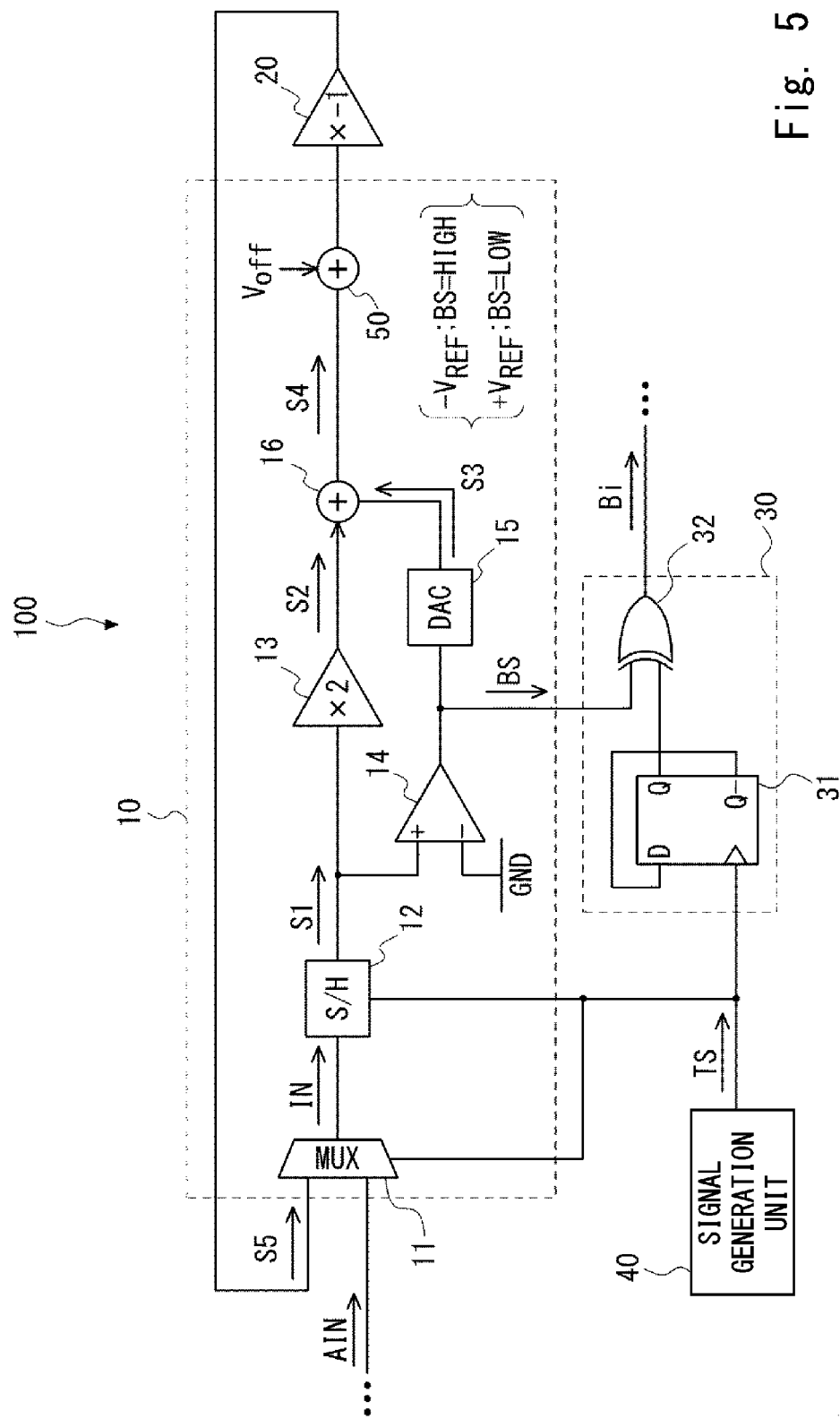
FIG. 5 shows an offset error in the A/D converter according to the first embodiment.

Next, an error in the A/D converter 100 according to this embodiment will be discussed. FIG. 5 shows an offset error in the A/D converter 100 according to the first embodiment. In the A/D converter 100, an offset error occurs due to the influence of, for example, amplification from the time when the input signal IN is input to the cycle processing unit 10 until the time when the analog signal S4 is output from the adder 16. In FIG. 5, a virtual adder 50 is inserted between the output of the cycle processing unit 10 and the inverter circuit 20, and the offset error $V_{off}$ is added. Thus, in the A/D converter 100, the offset error $V_{off}$ is added every cycle. Hereinafter, a common cyclic A/D converter is compared with the A/D converter 100 according to this embodiment, and reduction of an error in the A/D converter 100 according to this embodiment will be discussed.

Figure 6:
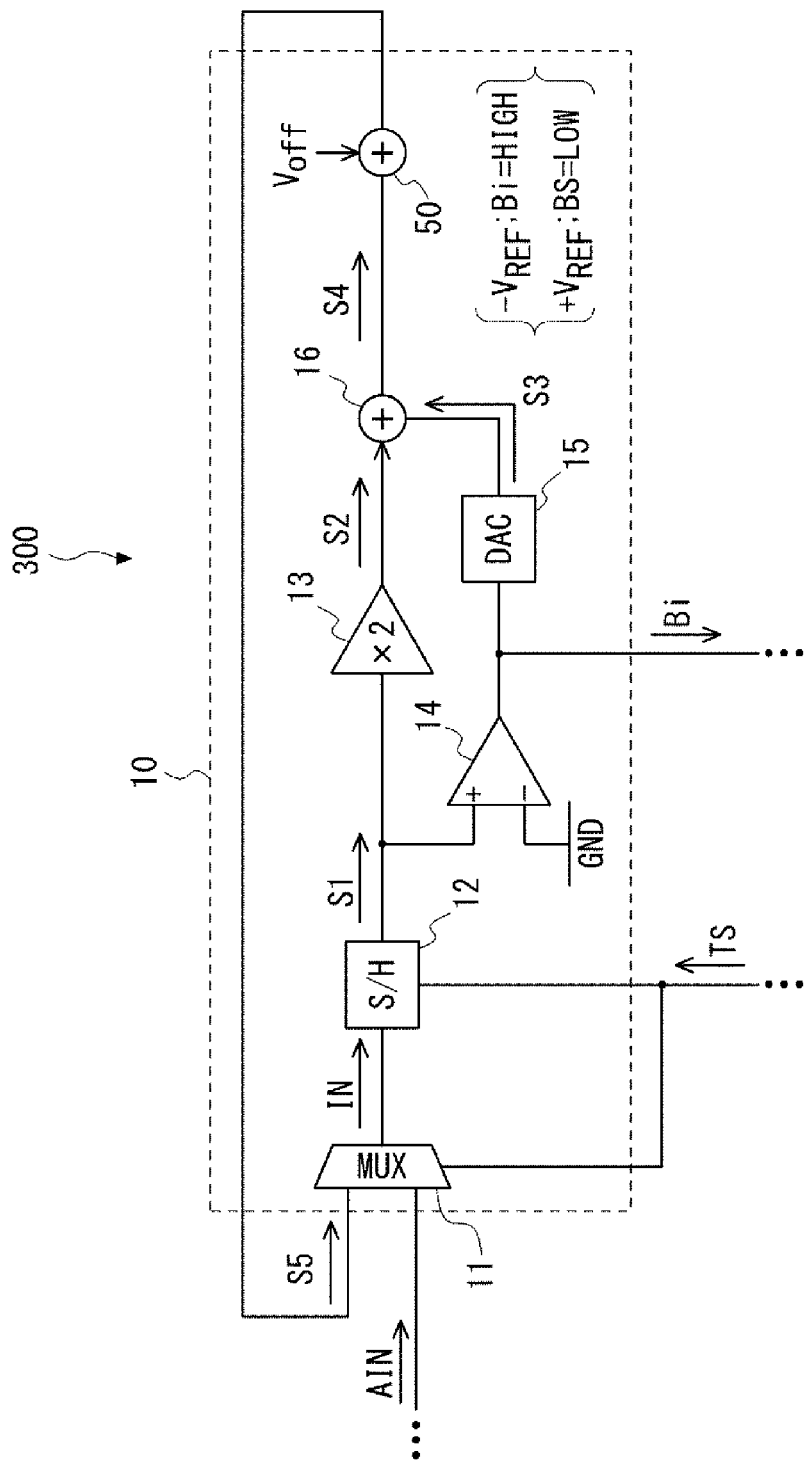
FIG. 6 schematically shows a configuration of an A/D converter according to a comparative example.

First, as an assumption to understand the reduction of an error in the A/D converter 100 according to this embodiment, an influence of an offset error in a common cyclic A/D converter will be considered. Here, an A/D converter in which the inverter circuit 20 and the output circuit 30 are removed from the A/D converter 100 according to this embodiment will be considered as an example as a configuration of a comparative example. FIG. 6 schematically shows a configuration of an A/D converter 300 according to the comparative example. Since the A/D converter 300 according to the comparative example does not need to correct a binary signal, because there is no inverter circuit 20, the signal output from the comparator 14 is output as the binary signal Bi indicating the value of the i-th bit.

In this case, a voltage $V_{i+1}$, of the analog signal S4 output from the adder 16 in the (i+1)th cycle is expressed by the following formula.

[Formula 1]

$$V_{i+1} = 2V_i + D_i V_{ref} + V_{off} \quad (1)$$

In this formula, $V_i$ is a voltage obtained by adding the offset error $V_{off}$ to the analog signal S4 output from the adder 16 in the i-th cycle. When $V_i$ is a positive value, $D_i$ is −1, while when $V_i$ is a negative value, $D_i$ is 1. Note that when $V_i$ is 0, $D_i$ may be configured to be one of −1 and 1 as necessary.

In the A/D converter 300 according to the comparative example, the offset error $V_{off}$ is integrated every cycle, because the cycle processing unit 10 is used repeatedly. Thus, the offset error $V_{off}$ added in a certain cycle is amplified twice by the amplifier 13 in each subsequent cycle. The offset error $V_{ei}$ included in the analog signal S4 output from the adder 16 in the i-th cycle is represented by the following formula.

[Formula 2]

$$V_{ei} = \sum_{k=0}^{i-1} 2^k \cdot V_{off} \quad (2)$$
$$= (2^{i-1} + 2^{i-2} + 2^{i-3} + \ldots + 1) V_{off}$$

In the N-bit cyclic A/D converter, since the voltage $V_{N-1}$ of the analog signal S4 output from the adder 16 in the (N−1)th cycle is used to determine the least significant bit LSB, a total error $V_{etot}$ of the offset error $V_{off}$ in the cyclic A/D converter 300 is expressed by the following Formula.

[Formula 3]

$$V_{etot} = (2^{N-2} + 2^{N-3} + 2^{N-4} + \ldots + 1) V_{off} \quad (3)$$
$$= (2^{N-1} - 1) V_{off}$$

Figure 7:
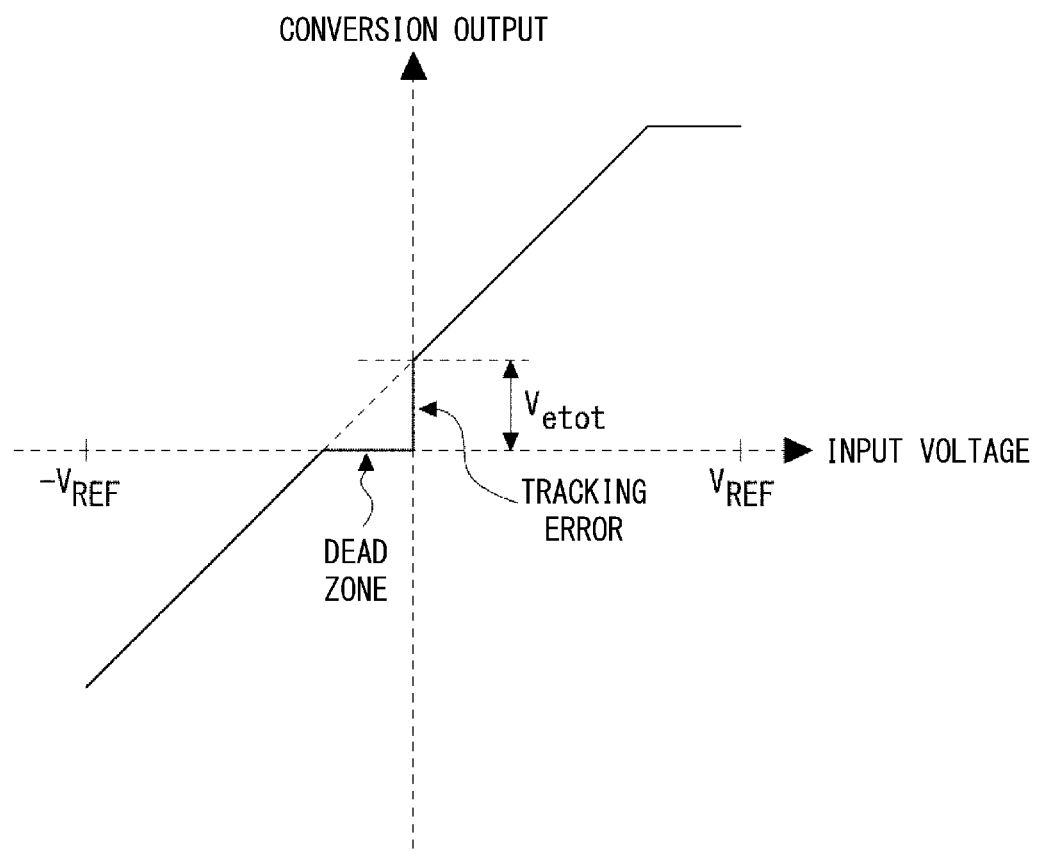
FIG. 7 shows A/D conversion characteristics when there is an offset error.

That is, it can be understood that the offset error is monotonically integrated as the number of cycles increases. FIG. 7 shows A/D conversion characteristics when there is an offset error. When there is an offset error, as shown in FIG. 7, the center of the conversion line with respect to an input voltage is shifted by the total error $V_{etot}$, and a dead zone where there is no sensitivity of the conversion output for a change in the input voltage and value jump in which some of the converted output values is not output occur. Thus, it is necessary to reduce the total error $V_{etot}$ in order to reduce a failure in the A/D conversion. In this configuration, as described below, the total error $V_{etot}$ is reduced by inverting the output of the adder 16 by the inverter circuit 20.

Next, an error in the A/D converter 100 according to this embodiment will be discussed. In this configuration, the voltage $V_{i+1}$ of the analog signal S5 output from the inverter circuit 20 in the (i+1)th cycle is expressed by the following formula.

[Formula 4]

$$V^{i+1} = -(2V_i + D_i V_{ref} + V_{off}) \quad (4)$$

In this configuration, the offset error integrated up to the previous cycle is inverted every cycle by the inverter circuit 20 provided after the adder 16. Thus, the offset error $V_{off}$ is canceled out every time the cycle changes. In this case, an offset error $V_{ei}$ included in the analog signal S5 output from the inverter circuit 20 in the i-th cycle is expressed by the following formula.

[Formula 5]

$$V_{ei} = \sum_{k=0}^{i-1} -(-2)^k \cdot V_{off} \quad (5)$$
$$= -\{(-2)^{i-1} + (-2)^{i-2} + (-2)^{i-3} + \ldots + 1\} V_{off}$$

In the case of the N-bit cyclic A/D converter, the total error $V_{etot}$ of the offset error $V_{off}$ in the A/D converter 100 is expressed by the following formula, because the voltage $V_{N-1}$ of the analog signal S5 in the (N−1)th cycle is used to determine the least significant bit LSB as described above.

[Formula 6]

$$V_{etot} = -\{(-2)^{N-2} + (-2)^{N-3} + (-2)^{N-4} + \ldots + 1\} V_{off} \quad (6)$$
$$= \frac{\{(-2)^{N-1} - 1\}}{3} V_{off}$$

When Formulas [3] and [6] are compared with each other, the A/D converter 100 according to this embodiment can reduce an absolute value of the total error $V_{etot}$ to about ⅓ as compared with the common A/D converter 300. It is thus understood that the A/D converter 100 according to this embodiment can reduce an error in the cyclic A/D converter. This makes it possible to satisfactorily prevent dead zones and value skips in the A/D conversion described with reference to FIG. 7.

Figure 8:
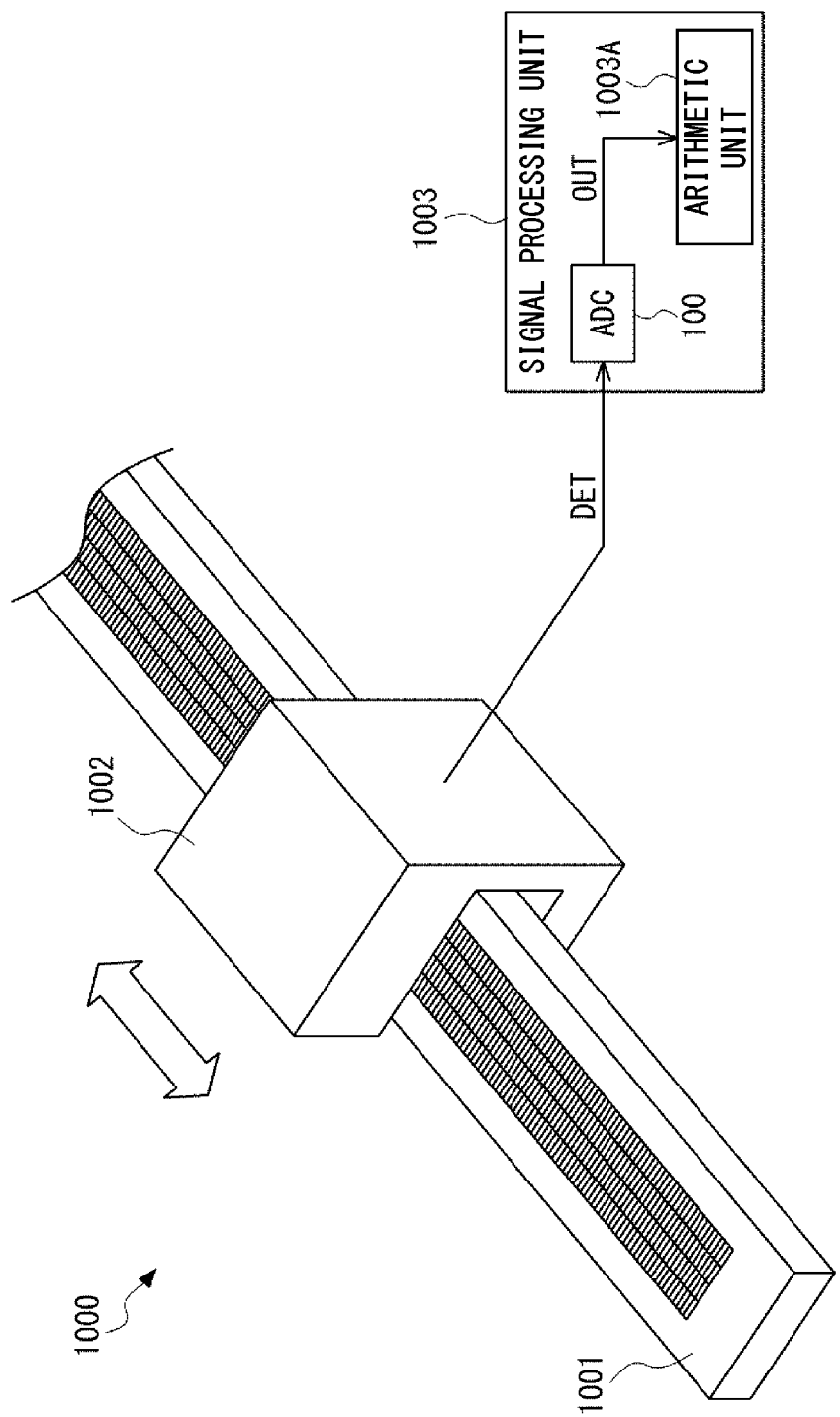
FIG. 8 schematically shows a configuration of an optical encoder on which the A/D converter according to the first embodiment is mounted.

Here, an example of the application of the A/D converter 100 according to the first embodiment will be described. The A/D converter 100 can be applied to, for example, analog to digital conversion in a displacement detection apparatus such as an encoder. FIG. 8 schematically shows a configuration of an optical encoder 1000 including the A/D converter 100 according to the first embodiment. The optical encoder 1000 is configured as a transmission type or reflective type encoder.

As shown in FIG. 8, the optical encoder 1000 includes a scale 1001, a detection head 1002, and a signal processing unit 1003. The scale 1001 and the detection head 1002 are configured to be relatively movable along a measurement direction, which is a longitudinal direction, of the scale 1001.

The scale 1001 is provided with a pattern used for position detection. Interference light is generated when the pattern is irradiated with light. The detection head 1002 detects a change in the interference light in the measurement direction, and outputs a detection signal DET, which is an electrical signal indicating a result of the detection, to the signal processing unit 1003. This detection signal DET corresponds to the above-described analog input signal AIN. In other words, the scale 1001 and the detection head 1002 constitute a displacement detector that detects a relative displacement between the scale 1001 and the detection head 1002.

The signal processing unit 1003 includes the A/D converter 100 according to this embodiment, and converts the received detection signal DET into a digital signal OUT. The digital signal OUT is output to, for example, an arithmetic unit 1003A and used for generating an origin signal and for detecting a position. The digital signal OUT is an N-bit digital signal obtained by converting the detection signal DET (i.e., corresponding to the analog input signal AIN) from analog to digital by the A/D converter 100.

As described above, the A/D converter 100 according to this embodiment can be mounted on a device such as a displacement detection apparatus. This makes it possible to reduce an A/D conversion error in a device on which the A/D converter 100 is mounted.

Second Embodiment

An A/D converter according to a second embodiment will be described. In the first embodiment, the A/D converter 100 that inverts a signal by the inverter circuit 20 provided separately from the cycle processing unit 10 has been described. On the other hand, in this embodiment, an example of a change in a configuration of the A/D converter so that a signal to be output is inverted by a cycle processing unit will be described.

Figure 9:
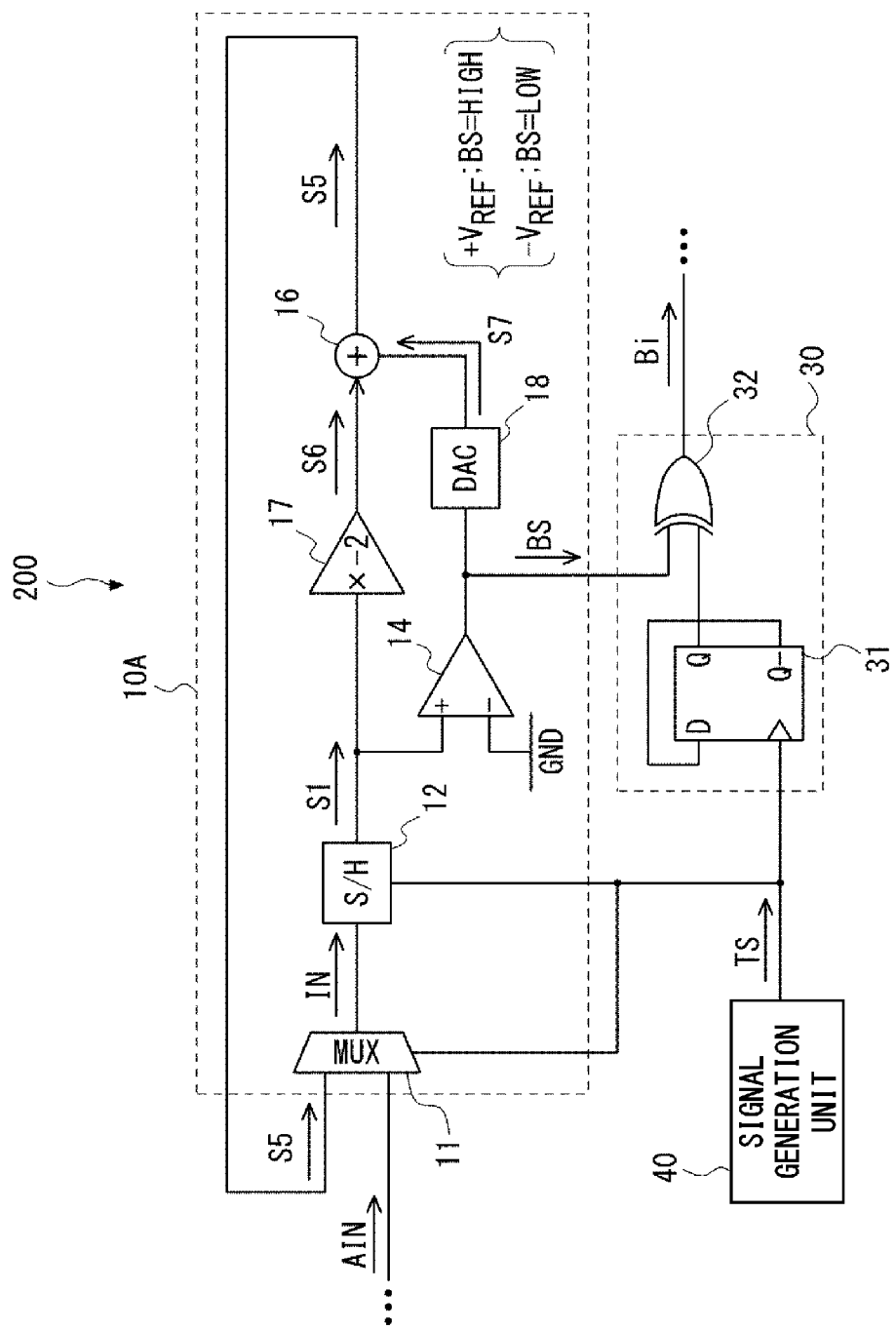
FIG. 9 schematically shows a configuration of an A/D converter according to a second embodiment.

FIG. 9 schematically shows a configuration of an A/D converter 200 according to the second embodiment. The A/D converter 200 includes a configuration in which the cycle processing unit 10 of the A/D converter 100 is replaced with a cycle processing unit 10A, and the inverter circuit 20 is removed.

The cycle processing unit 10A is configured as a 1-bit A/D conversion circuit that performs A/D conversion processing for one cycle of the cyclic A/D converter.

The cycle processing unit 10A outputs a binary signal BS indicating a result of the A/D conversion to the output circuit 30, and outputs an analog signal S5 input to the cycle processing unit 10A in the next cycle. The cycle processing unit 10A is configured to convert the analog input signal AIN from analog to digital in the first cycle, and convert the analog signal S5 output in the previous cycle from analog to digital in the second and subsequent cycles.

The output circuit 30 outputs a binary signal Bi indicating the i-th bit from the most significant bit corresponding to the i-th cycle according to the timing signal TS based on the binary signal BS. Here, i is a value indicating the number of cycles and is an integer of 1 or more and N or less.

As shown in FIG. 9, the cycle processing unit 10A includes a configuration in which the amplifier 13 and the D/A conversion circuit 15 of the cycle processing unit 10 are replaced with an inverting amplifier 17 and a D/A conversion circuit 18, respectively. Configurations of the cycle processing unit 10A other than the inverting amplifier 17 and the D/A conversion circuit 18 are the same as those of the cycle processing unit 10.

The inverting amplifier 17 outputs an analog signal S6 obtained by amplifying the sample signal S1 twice and inverting the amplified sample signal S1. That is, the analog signal S6 is a signal obtained by inverting the analog signal S2 in the A/D converter 100 according to the first embodiment (S6=−S2).

The D/A conversion circuit 18 converts the binary signal BS into an analog signal S7. Here, when the binary signal BS is "1" (HIGH), the D/A conversion circuit 18 outputs a signal having a voltage level of $+V_{REF}$ as the analog signal S7. When the binary signal BS is "0" (LOW), the D/A conversion circuit 18 outputs a signal having a voltage level of $-V_{REF}$ as the analog signal S7.

The adder 16 adds the analog signal S6 output from the inverting amplifier 17 and the analog signal S7 output from the D/A conversion circuit 18 (i.e., $-V_{REF}$ or $+V_{REF}$), and then outputs the analog signal S5.

The output circuit 30 is the same as the A/D converter according to the first embodiment, and a description thereof will be omitted.

Next, an operation of the A/D converter 200 according to this embodiment will be described. In the A/D converter 200, when the binary signal BS is "1" (HIGH), the D/A conversion circuit 18 outputs a signal having a voltage level of $+V_{REF}$ as the analog signal S7. In this case, the analog signal S5 output from the adder 16 is a signal obtained by adding the analog signal S7 and $+V_{REF}$. That is, S5=−2×S1+$V_{REF}$.

On the other hand, when the binary signal BS is "0" (LOW), the D/A conversion circuit 18 outputs a signal having a voltage level of $-V_{REF}$ as the analog signal S7. In this case, the analog signal S5 output from the adder 16 is a signal obtained by adding the analog signal S7 and $-V_{REF}$. That is, S5=−2×S1−$V_{REF}$.

Next, the analog signal S5 of the A/D converter 100 will be discussed. In the A/D converter 100, when the binary signal BS is "1" (HIGH), the D/A conversion circuit 15 outputs a signal having a voltage level of $-V_{REF}$ as the analog signal S3. In this case, the analog signal S4 output from the adder 16 is a signal obtained by adding the analog signal S3 and $-V_{REF}$. That is, S4=2×S1−$V_{REF}$. As a result, the analog signal S5 output from the inverter circuit 20 is S5=−2×S1+$V_{REF}$.

On the other hand, when the binary signal BS is "0" (LOW), the D/A conversion circuit 15 outputs a signal having a voltage level of $+V_{REF}$ as the analog signal S3. In this case, the analog signal S4 output from the adder 16 is a signal obtained by adding the analog signal S3 and $+V_{REF}$. That is, S5=2×S1+$V_{REF}$. As a result, the analog signal S5 output from the inverter circuit 20 is S5=−2×S1−$V_{REF}$.

Thus, although the A/D converter 200 does not include the inverter circuit 20 unlike the A/D converter 100, it can be understood that the A/D converter 200 can perform A/D conversion processing similar to that of the A/D converter 100 by changing the configuration of the cycle processing unit.

As described above, it can be understood that, with the A/D converter 200 according to this embodiment, like the A/D converter 100 according to the first embodiment, an error in the cyclic A/D converter can be reduced. This makes it possible to preferably prevent dead zones and value skips in A/D conversion.

As a matter of course, the A/D converter 200 according to this embodiment can be mounted on a device such as a displacement detection apparatus instead of the A/D converter 100. This makes it possible to reduce an A/D conversion error in a device including the A/D converter 200.

Other Embodiments

The present disclosure is not limited to the above-described embodiments, and can be appropriately changed without departing from the scope of the present disclosure. For example, in the above embodiments, the sample signal S1 is input to the non-inverted input terminal of the comparator 14, and the ground voltage GND is input to the inverted input terminal. However, the non-inverted input terminal and the inverted input terminal may be switched. For example, the ground voltage GND may be input to the non-inverted input terminal of the comparator 14 of the A/D converter 100 according to the first embodiment, and the sample signal S1 may be input to the inverted input terminal. In this case, the D/A conversion circuit 15 may output $-V_{REF}$ when the binary signal is "0" (LOW) and output $+V_{REF}$ when the binary signal is "1" (HIGH). In the initial state, the output of the Q terminal of the DFF 31 may be set to "1", and the output of the Q– terminal may be set to "0". By doing so, A/D conversion similar to that of the A/D converter 100 according to the first embodiment can be performed.

Further, for example, the ground voltage GND may be input to the non-inverted input terminal of the comparator 14 of the A/D converter 200 according to the second embodiment, and the sample signal S1 may be input to the inverted input terminal. In this case, the D/A conversion circuit 18 may output $+V_{REF}$ when the binary signal is "0" (LOW) and output $-V_{REF}$ when the binary signal is "1" (HIGH). In the initial state, the output of the Q terminal of the DFF 31 may be set to "1", and the output of the Q– terminal may be set to "0". By doing so, A/D conversion similar to that of A/D converter 200 according to the second embodiment can be performed.

The adder 16 of the A/D converter 100 according to the first embodiment may be replaced with a subtractor that subtracts the analog signal S3 from the analog signal S2. In this case, the D/A conversion circuit 15 may output $+V_{REF}$ instead of $-V_{REF}$ and output $-V_{REF}$ instead of $+V_{REF}$. By doing so, A/D conversion similar to that of the A/D converter 100 according to the first embodiment can be performed.

The adder 16 of the A/D converter 200 according to the second embodiment may be replaced with a subtractor that subtracts the analog signal S7 from the analog signal S6. In this case, the D/A conversion circuit 18 may output $+V_{REF}$ instead of $-V_{REF}$ and output $-V_{REF}$ instead of $+V_{REF}$. By doing so, A/D conversion similar to that of the A/D converter 200 according to the second embodiment can be performed.

The configuration of the cycle processing unit 10 is not limited to this configuration. The cycle processing unit may have another configuration as long as the cyclic operation of the cyclic A/D converter can be implemented.

For example, the configurations of the output circuits 30 of the A/D converters 100 and 200 are not limited to this configuration. An output circuit including another configuration may be used as long as the binary signal Bi can be output by correcting the binary signal BS like the output circuit 30.

In the above description, the amplification factor of the amplifier 13 of the cycle processing unit 10 has been described as twice, but this is merely an example. That is, the cycle processing unit may be configured using an amplifier including an amplification factor other than twice. Further, the amplification factor of the inverting amplifier 17 of the cycle processing unit 10A has been described as –2 times. However, this is only an example.

That is, the cycle processing unit may be configured using an inverting amplifier having an amplification factor other than –2.

Although the displacement detection apparatus has been described as a device on which the A/D converters 100 and 200 according to the above-described embodiments are mounted, this is merely an example. The A/D converter may be mounted on a detection device other than the displacement detection apparatus, or on various devices other than the detection device that requires the A/D converter to be mounted thereon.

In the above-described embodiments, the configuration in which a 1-bit binary signal is obtained by one cycle processing has been described, but this is only an example. For example, an A/D converter including a cycle processing unit that can obtain a digital signal of 2 bits or more in one cycle may be used instead.

It has been described above that the A/D converter is configured as a one-phase (single-phase) circuit. However, the A/D converter may be configured as a fully differential circuit depending on the application.

In the first embodiment, the cycle processing unit 10 and the inverter circuit 20 are described separately, but the cycle processing unit 10 and the inverting circuit 20 may be provided as one cycle processing unit, as a matter of course.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. An analog to digital converter that is a cyclic analog to digital converter for converting an analog input signal into a digital output signal by performing a plurality of times of cycle processing on the analog input signal, the analog to digital converter comprising:
   a cycle processing unit configured to perform the cycle processing and output a digital signal indicating a value of each bit of the digital output signal; and
   an output circuit configured to receive the digital signal output from the cycle processing unit and output, as an output signal, a signal obtained by inverting the digital signal every other cycle, wherein
   a signal input to the cycle processing unit in second and subsequent cycles is generated in the cycle processing in a previous cycle, and in the cycle processing, processing for inverting the signal input to the cycle processing unit is performed.

2. The analog to digital converter according to claim 1, wherein
the output circuit comprises:
a D flip-flop including an inverted output terminal connected to an input terminal; and
an exclusive or circuit, one input of the exclusive or circuit receiving the digital signal and the other input thereof being connected to an output terminal of the D flip-flop.

3. The analog to digital converter according to claim 2, wherein the output circuit is configured to output the digital signal as the output signal in odd-numbered cycles and output a signal obtained by inverting the digital signal as the output signal in even-numbered cycles.

4. The analog to digital converter according to claim 3, wherein, in an initial state, an output value of the output terminal of the D flip-flop is set to "0", and an output value of the inverted output terminal of the D flip-flop is set to "1".

5. The analog to digital converter according to claim 1, further comprising an inverter circuit configured to output a signal obtained by inverting an output of the cycle processing unit to the cycle processing unit.

6. The analog to digital converter according to claim 5, wherein
N is an integer of 2 or more,
the cycle processing unit is configured to:
convert the analog input signal into an N-bit digital signal by acquiring one bit of the digital signal in each of the cycle processing,
convert the analog input signal into the digital signal in a first cycle, and
convert a signal output from the inverter circuit in a previous cycle into the digital signal in the second and subsequent cycles.

7. The analog to digital converter according to claim 6, wherein
the cycle processing unit comprises:
a selection circuit configured to output the analog input signal in the first cycle and output the signal output from the inverter circuit in the second and subsequent cycles,
a sample holding circuit configured to sample the signal output from the selection circuit according to a timing signal and output the sampled signal;
a comparator configured to compare a voltage of the sampled signal and a ground voltage and output a result of the comparison as the digital signal;
a D/A conversion circuit configured to receive the digital signal, output a voltage obtained by inverting a reference voltage when the voltage of the sampled signal is higher than the ground voltage, and output the reference voltage when the voltage of the sampled signal is lower than the ground voltage;
an amplifier configured to amplify the voltage of the sampled signal twice; and
an adder configured to add the voltage amplified by the amplifier and the voltage output from the D/A conversion circuit and output the added voltage to the inverter circuit.

8. The analog to digital converter according to claim 5, wherein
the cycle processing unit comprises:
a selection circuit configured to output the analog input signal in the first cycle and output the signal output in the previous cycle in the second and subsequent cycles,
a sample holding circuit configured to sample the signal output from the selection circuit according to a timing signal and output the sampled signal;
a comparator configured to compare a voltage of the sampled signal and a ground voltage and output a result of the comparison as the digital signal;
a D/A conversion circuit configured to receive the digital signal, output a voltage obtained by inverting a reference voltage when the voltage of the sampled signal is higher than the ground voltage and output the reference voltage when the voltage of the sampled signal is lower than the ground voltage;
an inverting amplifier configured to amplify the voltage of the sampled signal twice and invert the amplified voltage; and
an adder configured to add the voltage output from the inverting amplifier and the voltage output from the D/A conversion circuit and output the added voltage.

9. The analog to digital converter according to claim 7, wherein
the sampled signal is input to a non-inverted input terminal of the comparator, and the ground voltage is input to an inverted input terminal of the comparator, and
the D/A conversion circuit is configured to output a voltage obtained by inverting the reference voltage when a value of the digital signal is "1" and output the reference voltage when the value of the digital signal is "0".

10. A displacement detection apparatus comprising:
a displacement detector configured to output an analog signal indicating a measured displacement; and
a signal processing unit configured to detect a displacement based on the analog signal indicating the measured displacement, wherein
the signal processing unit comprises:
the analog to digital converter according to claim 1; and
an arithmetic unit configured to calculate the displacement based on the digital signal output from the analog to digital converter, wherein
the analog to digital converter is configured to receive the analog signal indicating the measured displacement as the analog input signal and converts the analog signal into the digital signal.

11. An analog to digital conversion method in a cyclic analog to digital converter for converting an analog input signal into a digital output signal by performing a plurality of times of cycle processing on the analog input signal, the analog to digital method comprising:
using a signal generated in a previous cycle as an input to a next cycle processing, performing the cycle processing and outputting a digital signal indicating a value of each bit of the digital output signal; and
outputting, as an output signal, a signal obtained by inverting the digital signal every other cycle, wherein
a signal going through second and subsequent cycles is generated in the cycle processing in a previous cycle, and
in the cycle processing, processing for inverting the input signal is performed.

* * * * *